United States Patent
Lam et al.

(10) Patent No.: US 11,184,994 B2
(45) Date of Patent: Nov. 23, 2021

(54) CONFIGURABLE LINE CARD FLAPPER

(71) Applicant: CISCO TECHNOLOGY, INC., San Jose, CA (US)

(72) Inventors: Mandy Hin Lam, Fremont, CA (US); Vic Hong Chia, Sunnyvale, CA (US); M. Baris Dogruoz, Santa Clara, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 619 days.

(21) Appl. No.: 15/983,305

(22) Filed: May 18, 2018

(65) Prior Publication Data
US 2019/0357383 A1 Nov. 21, 2019

(51) Int. Cl.
*H05K 7/20* (2006.01)

(52) U.S. Cl.
CPC ..... *H05K 7/20145* (2013.01); *H05K 7/20209* (2013.01)

(58) Field of Classification Search
CPC ... G06F 1/26; G06F 1/32; G06F 1/324; G06F 1/329; G06F 1/3228; G06F 1/08; G06F 1/206; G06F 1/3203; G06F 1/3215; G06F 1/3231; G06F 1/3206; G06F 1/3296; G06F 1/3234; G06F 1/3237; G06F 1/3287; G06F 1/266; G06K 15/4055; Y04S 20/20; Y02D 10/00; H04L 12/10
See application file for complete search history.

(56) References Cited

U.S. PATENT DOCUMENTS

| | | | |
|---|---|---|---|
| 6,771,499 B2 * | 8/2004 | Crippen | G06F 1/20 16/277 |
| 7,688,593 B2 * | 3/2010 | Byers | H05K 7/20572 361/721 |
| 8,801,374 B1 | 8/2014 | Lima | |
| 9,301,431 B2 | 3/2016 | Esmaily et al. | |
| 2009/0097203 A1 | 4/2009 | Byers | |
| 2012/0156981 A1 | 6/2012 | Curtin | |
| 2013/0128455 A1 * | 5/2013 | Koblenz | H05K 7/20836 361/692 |
| 2014/0177168 A1 | 6/2014 | Scott et al. | |

(Continued)

FOREIGN PATENT DOCUMENTS

| | | |
|---|---|---|
| JP | H02254797 A | 10/1990 |
| JP | 2009123887 A | 6/2009 |
| JP | 2013008085 A | 1/2013 |

*Primary Examiner* — Zahid Choudhury

(57) ABSTRACT

According to one aspect, an apparatus includes a first component, a plurality of line card slots, a fan array, and a sensor arrangement. The first component has a first opening defined therein and a second opening defined therein. The first component includes a first configurable line card flapper is arranged to at least partially cover the first opening and a second configurable line card flapper is arranged to at least partially cover the second opening. The plurality of line card slots includes a first line card slot associated with the first opening and a second line card slot associated with the second opening. The fan array includes a plurality of fans. The sensor arrangement includes at least one sensor arranged to monitor at least one condition. The first and second configurable line card flappers are arranged to be configured using information obtained from the sensor arrangement.

18 Claims, 8 Drawing Sheets

(56) References Cited

U.S. PATENT DOCUMENTS

| | | | |
|---|---|---|---|
| 2016/0034007 A1* | 2/2016 | Helberg | H05K 7/20009 |
| | | | 361/679.47 |
| 2016/0128230 A1 | 5/2016 | Lam et al. | |
| 2016/0165760 A1* | 6/2016 | Kutsuzawa | H05K 7/20736 |
| | | | 361/679.5 |
| 2017/0347495 A1 | 11/2017 | Chia et al. | |
| 2018/0235106 A1* | 8/2018 | Curtis | H05K 7/20736 |
| 2019/0090382 A1* | 3/2019 | Cho | H05K 7/20727 |
| 2019/0357383 A1* | 11/2019 | Lam | H05K 7/20145 |

\* cited by examiner

CONFIGURABLE LINE CARD FLAPPER

TECHNICAL FIELD

The disclosure relates generally to systems which contain line cards, supervisor cards, fabric cards, input/output cards and/or blades that are cooled via air flow through the systems. More particularly, the disclosure relates to chassis system that includes individually configurable line card flappers that allow the air flow over individual line cards to be adjusted.

BACKGROUND

As power consumption and networking throughput requirements increase, the cooling capabilities of a system that includes a chassis, e.g., a chassis that contains components such as line cards, must be improved in order to ensure the proper performance of the system. Components within a chassis may have different cooling requirements. For example, the power dissipation of each line card within a chassis may vary widely.

Solutions used to address the cooling of a chassis and components within the chassis utilize overall ambient temperature, pressure, and/or air density information to adjust cooling. For example, when the ambient temperature in a chassis increases, the fan speed of fans in the chassis is increased to increase cooling capability. In addition, when there is a change in air density and ambient pressure, as for example due to an altitude change, a controller within a chassis may detect the change and adjust the fan speed of fans in the chassis such that desired operating conditions within the chassis may be achieved.

When a chassis includes multiple line cards that have different levels of power dissipation, the overall cooling within the chassis is typically predicated on the line card with the highest level of power dissipation. That is, cooling within the chassis is based such that the fan speed of all cooling fans is based on what is needed to provide cooling based on the highest level of power dissipation.

Typical methods used to provide cooling with a chassis often result in an inefficient use of cooling capacity. In many instances, an uneven air flow may result within the chassis when line cards have different resistances and power dissipation levels, as for example due to a by-pass effect in which air finds the path of least resistance.

BRIEF DESCRIPTION OF THE DRAWINGS

The disclosure will be readily understood by the following detailed description in conjunction with the accompanying drawings in which.

DESCRIPTION OF EXAMPLE EMBODIMENTS

General Overview

Figure 1:
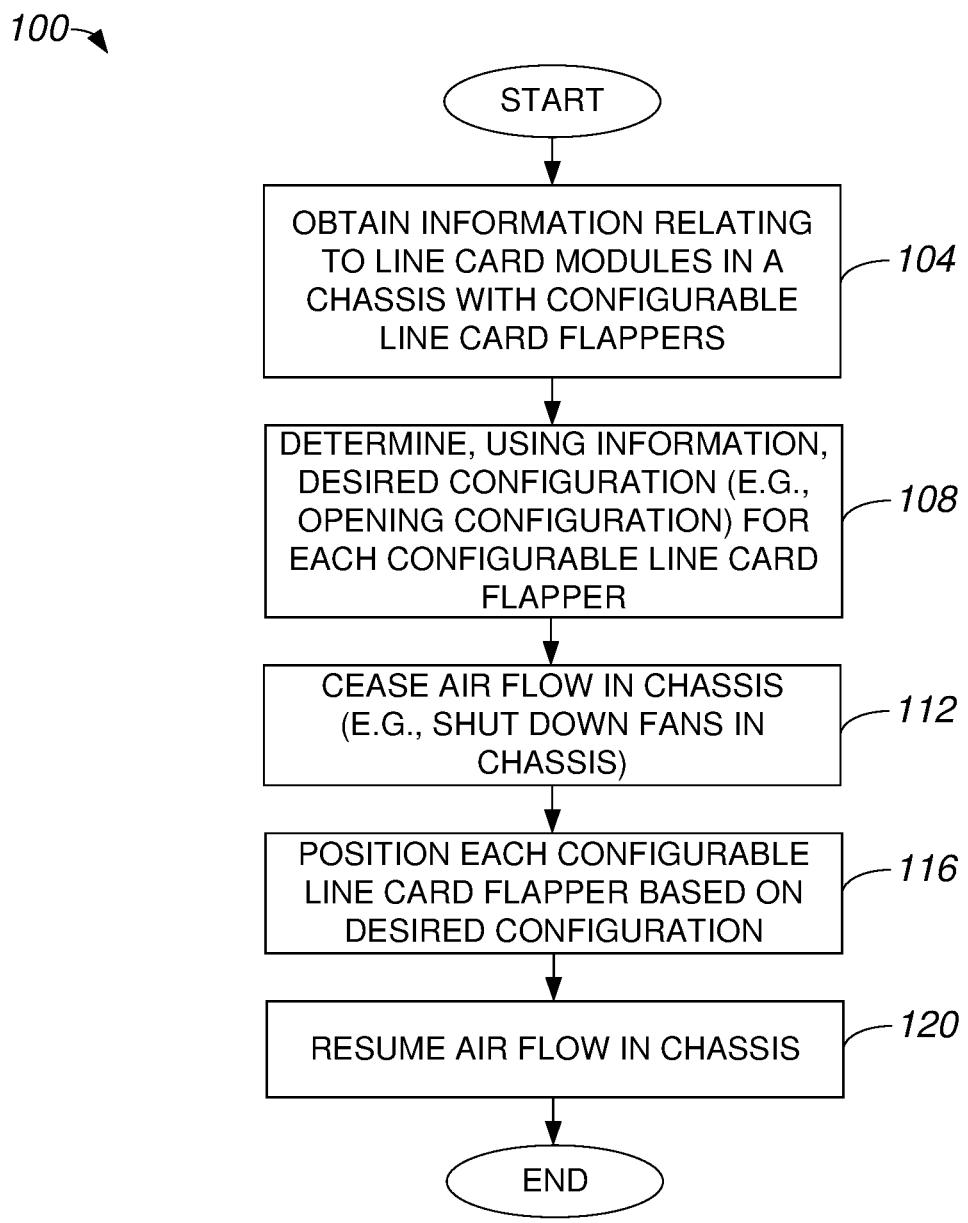
FIG. 1 is a flowchart which illustrates a method of providing air flow through a system, e.g., a modular system, using at least one configurable line card flapper in accordance with an embodiment.

In one embodiment, an apparatus includes a first component, a plurality of line card slots, a fan array, and a sensor arrangement. The first component has a first opening defined therein and a second opening defined therein, wherein the first component includes at least a first configurable line card flapper and a second configurable line card flapper, the first configurable line card flapper being arranged to at least partially cover the first opening, the second configurable line card flapper being arranged to at least partially cover the second opening. The plurality of line card slots includes a first line card slot and a second line card slot, the first line card slot being associated with the first opening and the second line card slot being associated with the second opening. The fan array includes a plurality of fans. The sensor arrangement includes at least one sensor arranged to monitor at least one condition, wherein the first configurable line card flapper is arranged to be configured using information obtained from the sensor arrangement and the second configurable line card flapper is arranged to be configured using information arranged from the sensor arrangement.

Description

Methods that are generally used to provide cooling within a chassis often result in an inefficient use of cooling capacity, as cooling fans are set to provide a desired level of cooling for a line card with a highest power dissipation level. That is, overall cooling within a chassis is typically performed at a level that cools a line card with the highest power dissipation level in the chassis. As a result, line cards with a lower power dissipation level may effectively be provided with excessive cooling, which is often an inefficient use of resources. Uneven air flow and cooling distribution with a chassis may also result from methods that are generally used to provide cooling within a chassis, due to the tendency of air to find a path of least resistance over which to flow.

The ability to control the amount of air flow in different parts of a chassis allows cooling in the chassis to be provided efficiently, i.e., allows for the efficient use and/or allocation of resources. In one embodiment, cooling within a chassis is provided at an individual line card level such that each line card within the chassis may be cooled through the efficient use of resources. By providing a chassis with individual line card flappers that are arranged to allow air flow over line cards to be adjusted based on power and thermal needs, each line card may be provided with a tailored amount of cooling that is appropriate for that line card.

Individual line card flappers may be pre-installed in a chassis such that each line card slot has a dedicated opening and a substantially dedicated line card flapper. Each line card flapper is arranged to open and, therefore, to close over an opening. The individual line card flappers in a chassis are generally individually controllable such that the line card flappers may be positioned in different configurations over the openings. As a result, the air flow over each line card may effectively be controlled by the amount an associated line card flapper is opened.

By allowing air flow over each line card to be individually controlled through the use of line card flappers to substantially control the size of associated openings in a chassis, the air flow over each line card may effectively be tailored to provide an appropriate level of cooling for each line card. For example, within a chassis, a first line card with a relatively high level of power dissipation may be provided with a first amount of air flow to cool the first line card to a desired temperature, while a second line card with a relatively low level of power dissipation may be provided with a second amount of air flow to cool the second line card to a desired temperature. Using line card flappers, the air flow through a chassis may be substantially controlled.

In many instances, an uneven air flow may result within a chassis when line cards have different resistances and power dissipation levels, as for example due to a by-pass effect in which air finds the path of least resistance. The use of line card flappers allows the air flow within a chassis to be controlled. For instance, line card flappers may be used to control air flow such that a more balanced overall air flow within the chassis may be achieved. That is, the overall cooling of the chassis may be substantially optimized. Alternatively, line card flappers may be used to control air flow such that more air flow may be provided over line cards that need more cooling, and less air flow may be provided over line cards that need less cooling. That is, the cooling of each line card may be substantially optimized.

In standard systems, within a chassis, if there is a first line card associated with a high resistance and a second line card associated with a low resistance, fans within the chassis may need to run at relatively high speeds to prevent the first line card from overheating due to relatively cool air flow being substantially "robbed," by the second line card when air flows through the path of least resistance. In a system which includes configurable air flow line card flappers, the line card flappers may be configured such that air flow is channeled at levels that account for line card resistances, with little or no air robbing, thereby allowing the fans within the chassis to run at lower speeds, thereby using less power.

Referring initially to FIG. 1, a method of providing air flow through a system that includes a chassis, e.g., a modular system, using at least one configurable line card flapper will be described in accordance with an embodiment. A method 100 of providing air flow through a system begins at step 104 in which information relating to line card modules in a chassis with configurable line card flappers is obtained. The information, which may include power usage data and environmental data such as pressure and temperature data, may be obtained from sensors located within the chassis. In one embodiment, the information may be obtained by a control system, as will be discussed below with reference to FIG. 5.

After information relating to line card modules is obtained, a determination is made in step 108 as to a desired configuration for each configurable line card flapper. It should be appreciated that a desired configuration for a configurable line card flapper may be a desired amount the configurable line card flapper is effectively opened with respect to an opening or perforation, or may relate to a desired amount of an opening or perforation that the configurable line card flapper is to substantially cover. The determination of the desired configuration for each configurable line card flapper may be made using the information obtained in step 104. For example, a desired configuration for a first line card flapper may be made using information relating to a corresponding first line card, and a desired configuration for a second line card flapper may be made using information relating to a corresponding second line card. Other information may be used to facilitate a determination of a desired configuration for a line card. Such other information may include, but is not limited to including, fan speed information and information which indicates amounts by which configurable line card flappers may be opened. In one embodiment, the determination of a desired configuration for each configurable line card flapper may be made using a control system associated with the chassis.

In step 112, air flow in the chassis may be ceased. That is, fans that provide air flow in the chassis may be shut down. Once the air flow in the chassis is ceased, each configurable line card flapper is positioned based on an associated desired configuration in step 116. As each configurable line card flapper is individually configurable, each configurable line card flapper may have a different desired configuration. One method of positioning a configurable line card flapper will be described below with reference to FIG. 4. After each configurable line card flapper is positioned, air flow is resumed in the chassis in step 120, and the method of providing air flow through a system is completed.

Figure 2:
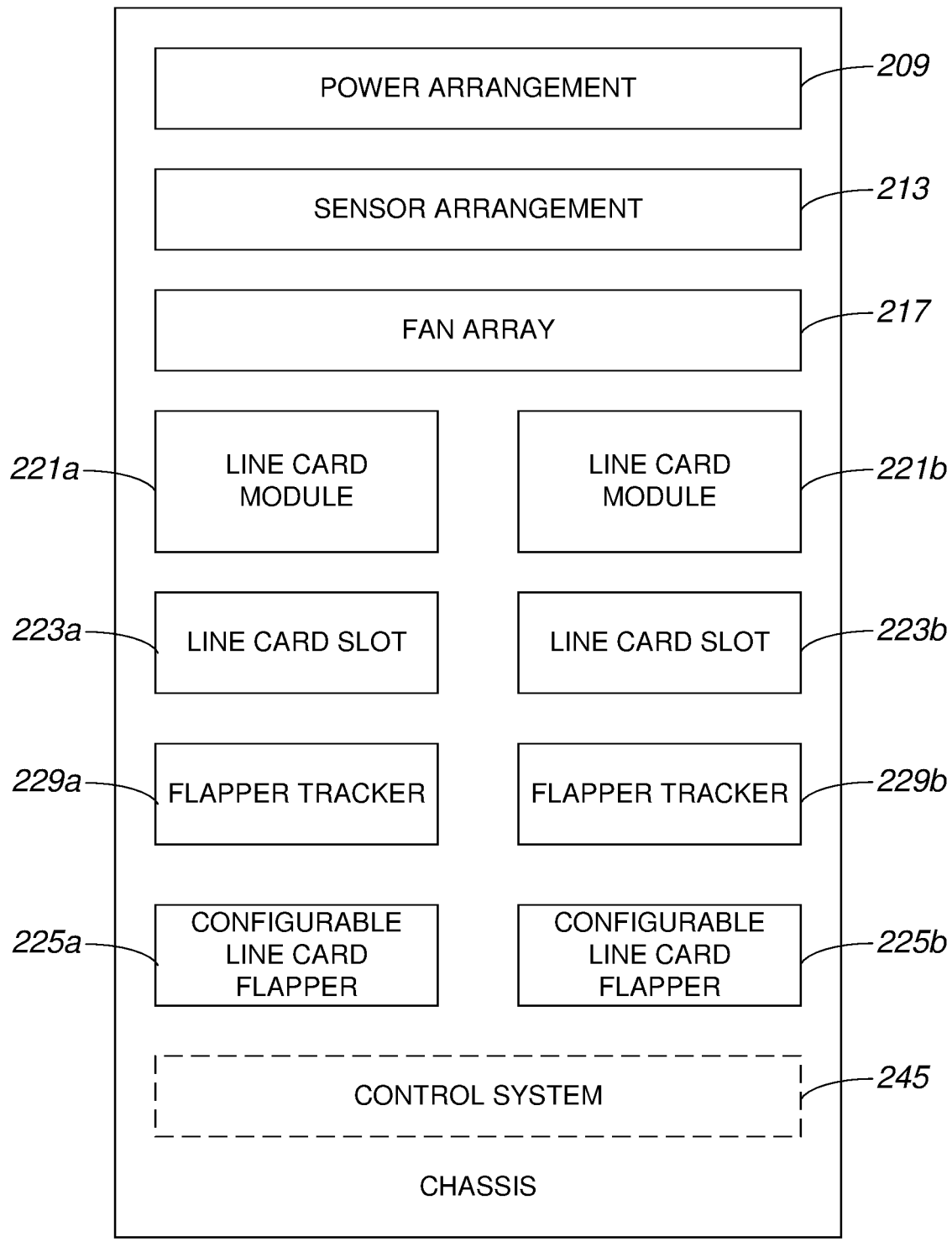
FIG. 2 is a block diagram representation of a system that includes configurable line card flappers in accordance with an embodiment.

FIG. 2 is a block diagram representation of a system that includes configurable line card flappers in accordance with an embodiment. A system 205, which may generally be a modular chassis, includes a power arrangement 209, a sensor arrangement 213, a fan array 217, a plurality of line card modules 221a, 221b, a plurality of configurable line card flappers 225a, 225b, a plurality of flapper trackers 229a, 229b, and an optional control system 245.

Power arrangement 209 is arranged to provide power to system 205. Power arrangement 209 may generally be any suitable power supply. As will be appreciated by those skilled in the art, power arrangement 209 may be arranged to obtain an electric current from a source (not shown), and to effectively deliver the current to a load, e.g., components within chassis 205.

Sensor arrangement 213 may include, but is not limited to including sensors arranged to monitor temperatures within system 205, pressures within system 205, and power demands within system 205. It should be appreciated that each line card module 221a, 221b may have an associated set of sensors included within sensor arrangement 213. That is, sensor arrangement 213 may include separate sensors for each line card module 221a, 221b. Sensor arrangement 213 may also generally includes sensors arranged to monitor overall conditions within chassis 205.

Fan array 217 includes one or more fans arranged to provide cooling within chassis 205. For example, fan array 217 may include individual fans that are each arranged to provide cooling to a particular line card module 221a, 221b. Fans within fan array 217 may be individually controllable, and may have different speeds. In one embodiment, fans included in fan array 217 may be held in a fan tray and are powered using power arrangement 209.

Line card modules 221a, 221b are arranged to be substantially plugged into, or generally interfaced with, line card slots 223a, 223b in chassis 205. As will be appreciated by those skilled in the art, line card modules 221a, 221b may be line cards or digital line cards that include circuitry and/or application specific integrated circuits (ASICs) on printed circuit boards (PCBs). Line card module 221a, 221b may be any suitable line card modules. In one embodiment, line card modules 221a, 221b may be Ethernet line cards, asynchronous transfer mode (ATM) line cards, packet transport line cards, supervisor cards, fabric cards or the like. Line card slots 223a, 223b are arranged to receive or to otherwise interface with line card modules 221a, 221b such that power from power arrangement 209 may be provided to line card modules 221a, 221b.

Each line card module 221a, 221b has a corresponding flapper tracker 229a, 229b and a corresponding configurable line card flapper 225a, 225b. Flapper trackers 229a, 229b are configured to effectively position configurable line card flappers 225a, 225b. In other words, flapper trackers 229a, 229b may be set to cause configurable line card flappers 225a, 225b to essentially be open particular amounts such that openings or perforations (not shown) are covered a desired amount. For example, line card module 221a may have a corresponding opening (not shown) that is arranged to be covered or obscured by a desired amount by configurable line card flapper 225a, where the position of configurable line card flapper 225a is arranged to be substantially set by flapper tracker 229a. Flapper trackers 229a, 229b are mechanisms used to control the flapper position and maintain the position during operation, as will be discussed below with respect to FIGS. 3A-3C. Examples of flapper trackers 229a, 229b include, but are not limited to, mechanical pins, electrical feedback control mechanisms, and/or a combination of the former and the latter.

In one embodiment, flapper trackers 229a, 229b are installed on line card modules 221a, 221b. The locations at which flapper trackers 229a, 229b are installed may be based upon any suitable factors including, but not limited to including, power demands associated with line card modules 221a, 221b. Flapper trackers 229a, 229b are generally mechanisms used to control flapper opening percentages. Flapper trackers 229a, 229b may include mechanisms including, but not limited to including, mechanical pins, electrical feedback control mechanism, and/or a combination of pins and feedback control mechanisms.

By performing card level airflow analysis and numerical simulations, an amount of airflow substantially required for desired, e.g., proper, thermal management of a line card may be determined. That is, the amount of airflow needed for each line card may be substantially optimized. Hence, by performing chassis level airflow analysis and numerical simulations, proper positioning such as a substantially optimized position in the case of normal operation of a flapper may be determined such that the amount of airflow required for proper thermal management of a line is obtained. Flapper position may be changed or adjusted depending on factors including, but not limited to including, ambient temperature, ambient pressure, density of air, instantaneous specific application-specific integrated circuit (ASIC) temperature and power, overall card level power, minor or major alarms associated with the ASICs, and/or fan speed. In one (simpler) version of the application, flapper trackers are pre-designed and pre-configured to work with various line cards in different chassis. In one embodiment, a line card assembly may include a closed loop feedback control system which communicates with a micro-stepper electric motor to control the length of the flapper tracker pin. Based on individual configurations of line cards in a chassis, the micro-stepper motor may adjust the length of the flapper tracker pins and maintain the desired positions of the flapper tracker pins.

Configurable line card flappers 225a, 225b may generally be components which are arranged to be "opened" using a hinge arrangement such that openings (not shown) may be at least partially obscured based on the positioning of line card flappers 225a, 225b as will be described below with reference to FIGS. 3A-3C.

An optional control system 245 is arranged to process information obtained from sensor arrangement 213, and to determine appropriate positions, configuration, and/or orientations for configurable line card flappers 225a, 225b. Optional control system 245 may generally either be located within chassis 205, or may be separate from chassis 205 but be in communication with chassis 205. Optional control system 245 may generally cause flapper trackers 229a, 229b to be configured to enable configurable line card flappers 225a, 225b to be substantially locked into desired positions. In addition, optional control system 245 may be arranged to effectively turn on fans in fan array 217, and to effectively turn off fans in fan array 217.

Figure 3A:
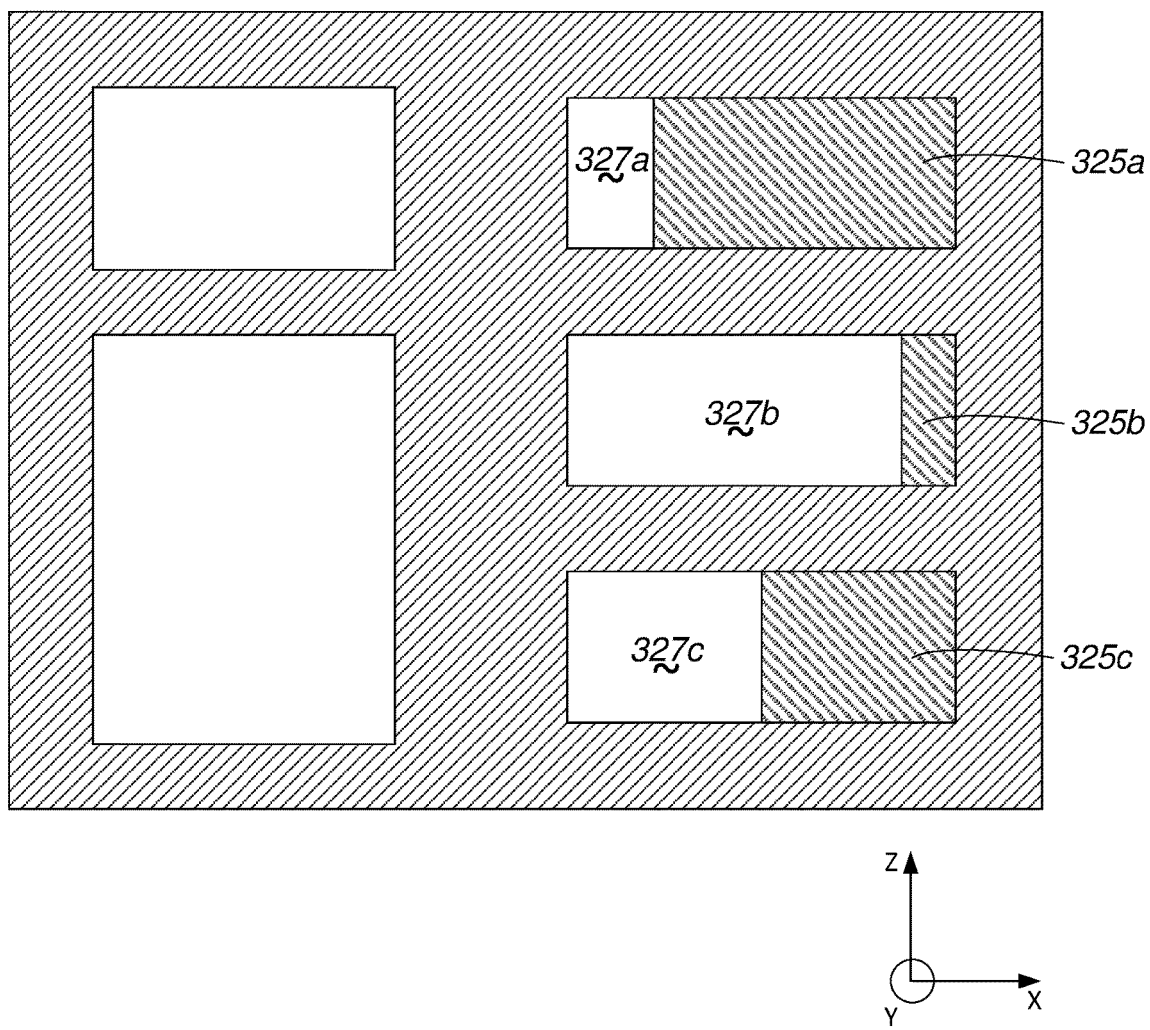
FIG. 3A is a first diagrammatic front-view representation of a chassis component that includes line card flappers in accordance with an embodiment.
Figure 3B:
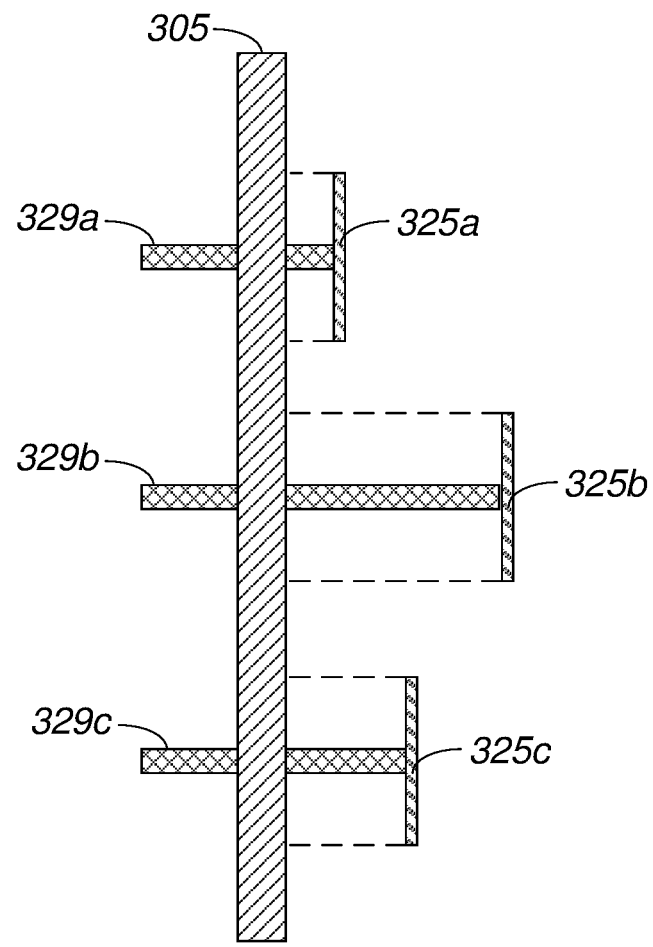
FIG. 3B is a second diagrammatic side-view representation of a chassis component that includes line card flappers, e.g., chassis component 305 of FIG. 3A, in accordance with an embodiment.
Figure 3B:
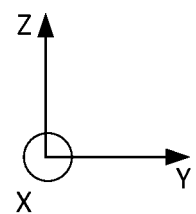
Figure 3C:
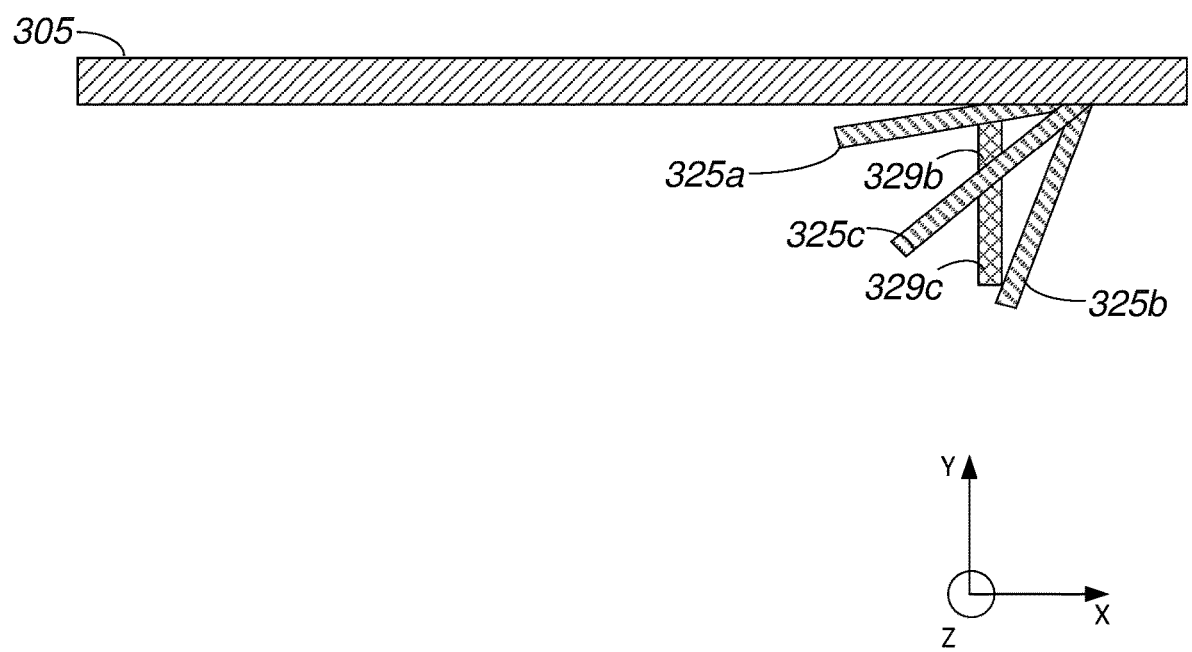
FIG. 3C is a diagrammatic top-view representation of a chassis component that includes line card flappers, e.g., chassis component 305 of FIG. 3A, in accordance with an embodiment.

FIGS. 3A-3C are a diagrammatic representation of a chassis component that includes line card flappers in accordance with an embodiment. A chassis component 305 is generally part of an overall chassis that effectively houses line cards and fans. FIG. 3A is a view of a first side of chassis component 305, FIG. 3B is a view of a second side of chassis component 305, and FIG. 3C is a top view of chassis component 305. As shown, chassis component 305 has openings or perforations 327a-c defined therein. It should be appreciated that each line card (not shown) contained within an overall chassis may have an associated opening 327a-c.

In general, each opening 327a-c is associated with a corresponding line card slot (not shown) and, hence, a corresponding line card (not shown). Each opening 327a-c is arranged to be substantially covered by a corresponding configurable line card flapper 325a-c. That is, each line card flapper 325a-c is configured such that, in an xz-plane, a corresponding opening 327a-c may be effectively covered or obscured. In one embodiment, each line card flapper 325a-c is arranged to cover a corresponding opening 327a-c such that between approximately ten percent and approximately ninety-five percent of the corresponding opening 327a-c is covered. However, it should be understood that openings 327a-c may be covered by less than ten percent or more than ninety-five percent. As shown, line card flapper 325a is opened less than line card flapper 325c and, hence, line card flapper 325a covers more of opening 327a than line card flapper 325c covers of opening 327c. Similarly, line card flapper 325c is opened less than line card flapper 325b and, hence, line card flapper 325c covers more of opening 327c than line card flapper 325b covers of opening 327b.

Each flapper tracker 329a-c is arranged to allow a corresponding line card flapper 325a-c to be substantially held in a desired position. In other words, each flapper tracker 329a-c is configured to move a corresponding line card flapper 325a-c, and to substantially cause the corresponding line card flapper 325a-c to at least be temporarily locked in a desired position. Flapper trackers 329a-c, which may be tracker pins, are effectively used to activate line card flappers 325a-c. The length and position of each flapper tracker 329a-c may be modified in order to adjust the amount by which corresponding line card flappers 325a-c substantially cover corresponding openings 327a-c. In one embodiment, flapper trackers 329a-c may be telescoping or otherwise extendable pins which may be deployed and locked into position using mechanical actuators (not shown). Flapper trackers 329a-c may be individually deployed and locked such that line card flappers 325a-c may effectively be opened different amounts. Flapper trackers 329a-c effectively overlap in the view shown in FIG. 3C. In other words, with respect to FIG. 3C, flapper trackers 329a-c are in the same yz-plane, and flapper tracker 329a is effectively not visible due to the amount by which line card flapper 325a is opened.

Figure 4:
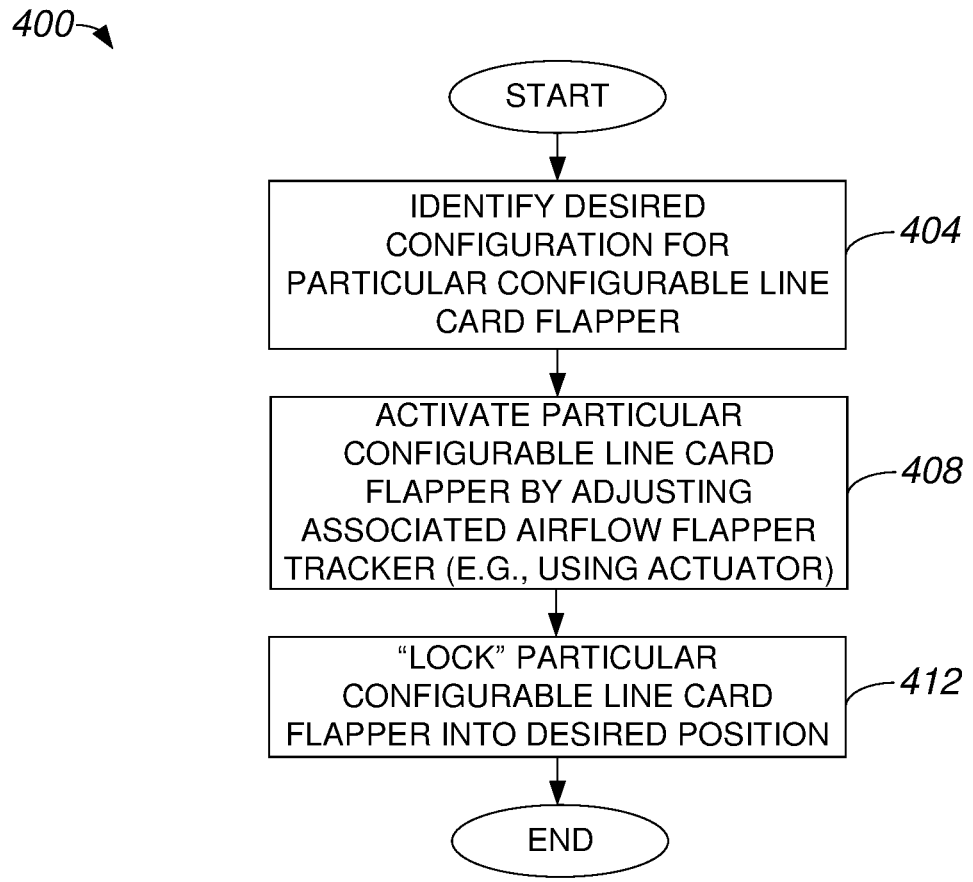
FIG. 4 is a flowchart which illustrates a method of positioning a configurable line card flapper in accordance with an embodiment.

Referring next to FIG. 4, a method of positioning a configurable line card flapper will be described in accordance with an embodiment. A method 400 of positioning a configurable line card flapper begins at step 404 in which a desired configuration is identified for a particular configurable line card flapper that is part of a chassis. It should be appreciated that the particular line card flapper may be one of multiple line card flappers of a chassis, and that each of the multiple line card flappers may have different desired configurations. A desired configuration for a line card may be determined based on information obtained from sensors within the chassis, as described above. Once the desired configuration for the particular configurable line card flapper is identified, as for example based on power demands of an associated line card, process flow moves to step 408 in which the particular configurable line card flapper is effectively activated, or moved into a desired position, by adjusting an associated line card flapper tracker. In other words, the associated line card flapper tracker is actuated to move the particular configurable line card flapper into a desired position. It should be appreciated that the desired position is a position that enables an opening or perforation in a chassis to be substantially covered by the particular configurable line card flapper such that a desired amount of opening is achieved, e.g., an opening of between approximately ten percent and approximately ninety-five percent. Any suitable method may generally be used to trigger the line card flapper tracker such that the line card flapper tracker activates the configurable line card flapper. For example, an actuator arrangement and/or a piston arrangement may be used to move, e.g., extend, a line card flapper tracker by an amount needed to cause the configurable line card flapper to substantially achieve a desired position.

After the associated line card flapper tracker is adjusted in step 408, the particular configurable line card is effectively locked into a desired position. A pin on the line card may push against a flapper which is supported by a hinge and/or a spring mechanism. If a stepper motor is used to position a flapper, the position of the flapper may be maintained with a lock on the motor. In one embodiment, the associated line card flapper tracker is locked to enable the particular configurable line card to be substantially held in the desired position. Upon the particular configurable line card being effectively locked into a desired position, the method of positioning a configurable line card flapper is completed.

Figure 5:
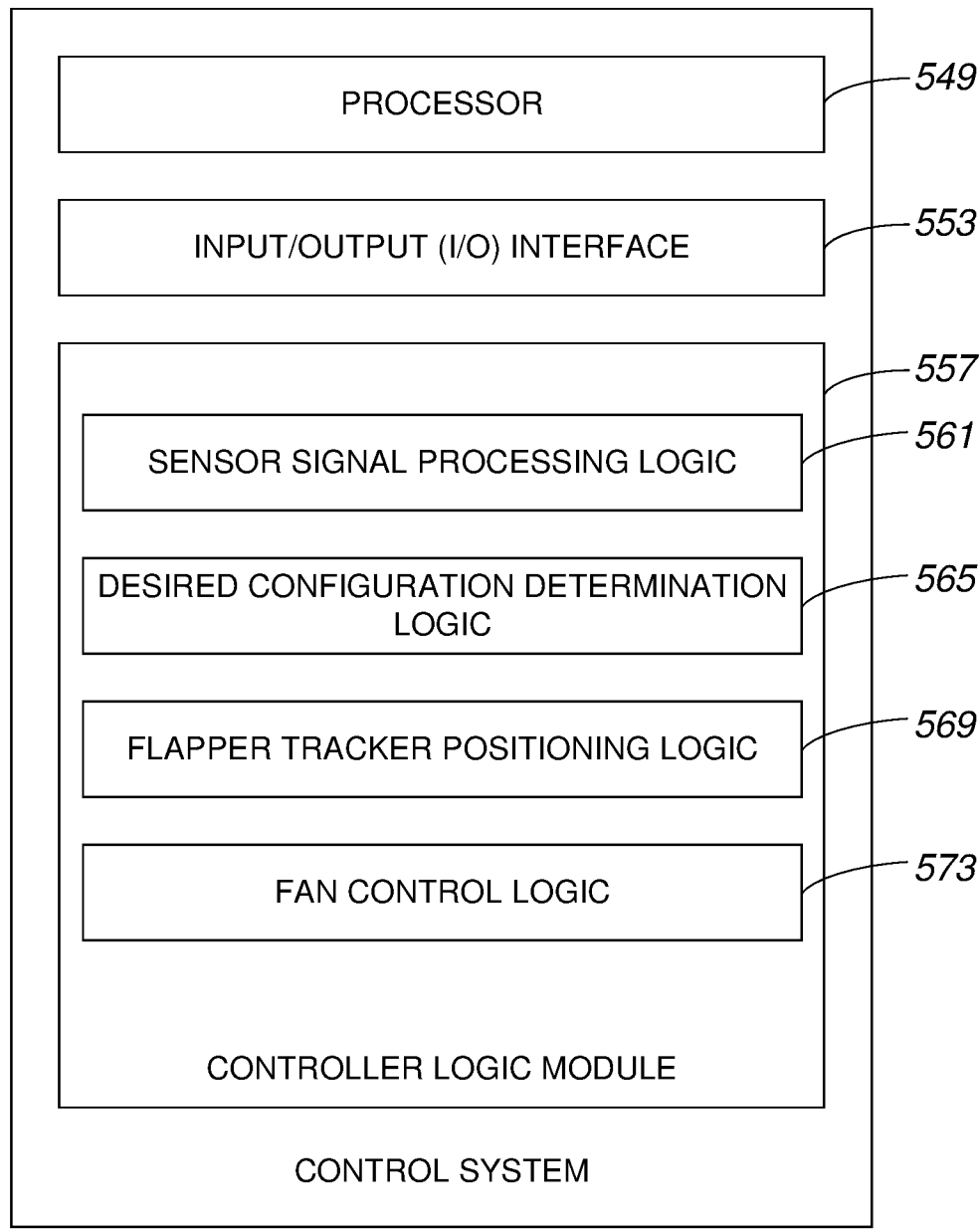
FIG. 5 is a block diagram representation of a control system that is arranged to position configurable line card flappers in accordance with an embodiment.

As previously mentioned, a control system may be used to process information relating to conditions within a chassis, and to effectively determine how to position configurable line card flappers such that desired conditions within a chassis may be achieved. With reference to FIG. 5, a control system that is arranged to position configurable line card flappers will be described in accordance with an embodiment. A control system 545 is generally arranged to obtain information, and to process the information in order to determine a desired configuration for each line card flapper of a plurality of line card flappers in a chassis. Control system 545 may also, in some embodiments, cause flapper trackers to be positioned such that the desired configuration for each line card flapper of a plurality of line card flappers may be achieved. For example, control system 545 may cause flapper trackers to be positioned by providing control signals to actuators arranged to move the flapper trackers.

Control system 545 includes a processor 549, an input/output (I/O) interface 553, and a controller logic module 557. Processor 549 is typically one or more microprocessors, and I/O interface 553 generally includes at least one port that is arranged to obtain information, as for example from a sensor that monitors a temperature associated with a chassis, and to provide information, as for example to a flapper tracker. I/O interface 553 may be arranged to receive and to send information on a bus within a chassis, or across a network.

Controller logic module 557, which may include hardware and/or software logic arranged to be executed by processor 549, includes sensor signal processing logic 561, desired configuration determination logic 565, flapper tracker positioning logic 569, and fan control logic 573. Sensor signal processing logic 561 is arranged to process signals obtained from sensors that monitor conditions within a chassis, e.g., the temperature and/or pressure near each line card in a chassis. Desired configuration determination logic 565 is arranged to determine how each line card flapper is to be positioned in order to achieve a desired conditions within a chassis using, for example, the output of sensor signal processing logic 561. In one embodiment, desired configuration determination logic 565 is arranged to determine how much of each opening or perforation in a chassis is to be substantially obstructed by a corresponding line card flapper to achieve the desired conditions. Flapper tracker positioning logic 569 is arranged to determine a configuration or position for a flapper tracker in order for an associated line card flapper to be positioned to achieve desired conditions within a chassis. In one embodiment, flapper tracker positioning logic 569 may be arranged to activate a flapper tracker, as for example by causing an actuator to extend or to move the flapper tracker. Fan control logic 573 is arranged to turn off, or to otherwise disengage, fans such that line card flappers may be positioned. Fan control logic 573 is also arranged to turn on, or to otherwise engage, fans such that air flow may be provided within a chassis. It should be appreciated that fan control logic 573 may generally also adjust the speed at which fans turn.

Figure 6:
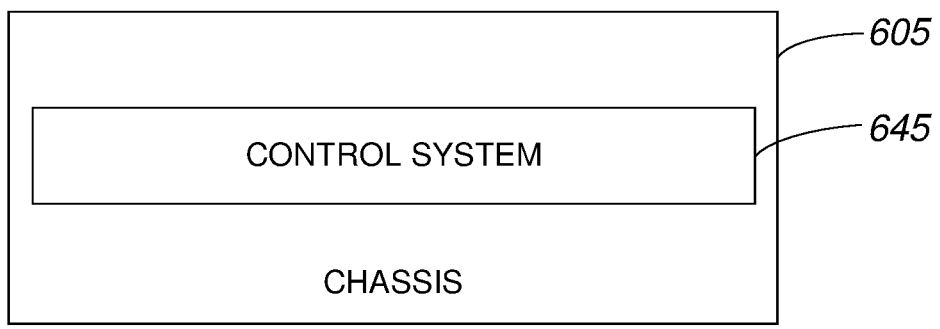
FIG. 6 is a block diagram representation of a control system that is arranged in a chassis in accordance with an embodiment.

Control system 545 may be incorporated substantially into a chassis, e.g., chassis 205 of FIG. 2, or may be substantially separate from a chassis but in communication with the chassis. FIG. 6 is a block diagram representation of a control system that is arranged in a chassis in accordance with an embodiment. As shown, a chassis 605 may be arranged such that a control system 645 is contained substantially within chassis 605.

Although only a few embodiments have been described in this disclosure, it should be understood that the disclosure may be embodied in many other specific forms without departing from the spirit or the scope of the present disclosure. By way of example, although a line card flapper has generally been described as being positioned such that a hinge is used to substantially specify an amount the line card flapper is opened, the present disclosure is not limited to the use of a hinge to effectively control the amount a line card flapper is opened, or otherwise obstructs an opening. For instance, a line card flapper may be arranged to slide over an opening to control an amount of the opening or perforation that is covered by, or obstructed by, the line card flapper.

In one embodiment, a line card flapper may be positioned based on the desired conditions for a corresponding line card. That is, a line card flapper may be positioned to cover an opening or perforation to achieve substantially optimal conditions for a corresponding line card. Alternatively, however, a plurality of line card flappers may be positioned based on the desired conditions for a chassis in general. For example, a first line card flapper that corresponds to a first line card in a chassis may be positioned to cover an opening or perforation not to achieve substantially optimal conditions for the first line card but, rather, to cooperate with other line card flappers to achieve substantially optimal conditions for the overall chassis.

A line card flapper may be formed as a single piece, or may be formed as multiple pieces with respect to flapper trackers. In other words, rather than having a single line card flapper arranged to substantially cover a single opening in a chassis as desired, multiple line card flapper components may instead be arranged to cover a single opening in a chassis. For example, a series of line card flapper components may be arranged to be positioned to cover portions of a single opening without departing from the spirit or the scope of the disclosure.

A chassis that includes configurable line card flappers may generally be configured such that when the line card flappers are all fully open, e.g., when the line card flappers cover or obscure a substantially minimum amount of their corresponding openings in the chassis, and fans within the chassis are operating at their substantially maximum speeds, at least a desired amount of cooling within the chassis may be maintained. In other words, when configurable line card flappers of a chassis are fully open and when fans are operating at substantially maximum capacity, substantially all line cards within the chassis may be cooled at least to appropriate, e.g., desired, levels.

In one embodiment, cooling within a chassis may be controlled by controlling both the speed at which fans in a fan tray are turning, and amounts that the line card flappers are opened. For example, operating the fans at a relatively low speed while opening line card flappers by larger amounts may achieve a similar amount of cooling as operating the fans at a relatively high speed while opening line card flappers by smaller amounts. It may be desirable to operate fans at lower speeds when possible in order to more efficiently utilize power and/or to substantially mitigate acoustic noise, e.g., to reduce power consumption and/or acoustic noise. On the other hand, it may be desirable to operate fans at high speeds when it is more efficient to have line card flappers opened by smaller amounts, e.g., when there is concern about contaminating line cards in a chassis. Generally, the choice of a fan speed and amounts to open line card flappers in a chassis may be made to allow for the power consumption within the chassis to be substantially optimized.

Flappers and flapper trackers may generally be made from any suitable material. Suitable materials may include, but are not limited to including, sheet metals such as stainless steel or aluminum and plastics capable of withstanding relatively high temperatures and/or pressures. Further, it should be appreciated that flapper trackers may include electrical feedback control mechanisms.

The embodiments, e.g., embodiments of a control system, may be implemented as hardware, firmware, and/or software logic embodied in a tangible, i.e., non-transitory, medium that, when executed, is operable to perform the various methods and processes described above. That is, the logic may be embodied as physical arrangements, modules, or components. A tangible medium may be substantially any computer-readable medium that is capable of storing logic or computer program code which may be executed, e.g., by a processor or an overall computing system, to perform methods and functions associated with the embodiments. Such computer-readable mediums may include, but are not limited to including, physical storage and/or memory devices. Executable logic may include, but is not limited to including, code devices, computer program code, and/or executable computer commands or instructions.

It should be appreciated that a computer-readable medium, or a machine-readable medium, may include transitory embodiments and/or non-transitory embodiments, e.g., signals or signals embodied in carrier waves. That is, a computer-readable medium may be associated with non-transitory tangible media and transitory propagating signals.

The steps associated with the methods of the present disclosure may vary widely. Steps may be added, removed, altered, combined, and reordered without departing from the spirit of the scope of the present disclosure. For example, while a method of providing air flow through a system has been described as including the ceasing of air flow prior to adjusting the position of each configurable line card flapper in a chassis, it should be appreciated that air flow may instead continue through the system during positioning of configurable line card flappers. Therefore, the present examples are to be considered as illustrative and not restrictive, and the examples is not to be limited to the details given herein, but may be modified within the scope of the appended claims.

What is claimed is:

1. An apparatus comprising:
   a first component, the first component having a first opening defined therein, the first component further having a second opening defined therein, wherein the first component includes at least a first configurable line card flapper and a second configurable line card flapper, the first configurable line card flapper being arranged to at least partially cover the first opening, the second configurable line card flapper being arranged to at least partially cover the second opening;
   a plurality of line card slots, the plurality of line card slots including a first line card slot and a second line card slot, the first line card slot being associated with the first opening and the second line card slot being associated with the second opening;
   a fan array, the fan array including a plurality of fans;
   a sensor arrangement, the sensor arrangement including at least one sensor arranged to monitor at least one condition, wherein the first configurable line card flapper is arranged to be configured using information obtained from the sensor arrangement and the second configurable line card flapper is arranged to be configured using information arranged from the sensor arrangement;
   a plurality of flapper trackers, the plurality of flapper trackers comprising a first flapper tracker operable to position the first configurable line card flapper and a second flapper tracker operable to position the second configurable line card flapper;
   a first line card module interfaced with the first line card slot, the first flapper tracker installed on the first line card module; and
   a second line card module interfaced with the second line card slot, the second flapper tracker installed on the second line card module;
   wherein the apparatus comprises a chassis housing the first line card module, the second line card module, and the fan array and wherein the first flapper tracker installed on the first line card module and the second flapper tracker installed on the second line card module each comprise a mechanical pin for positioning the first configurable line card flapper or the second configurable line card flapper and an electrical feedback control system.

2. The apparatus of claim 1 further including:
a control system, the control system being arranged to use the information to determine a first desired configuration for the first configurable line card flapper and to determine a second desired configuration for the second configurable line card flapper.

3. The apparatus of claim 2 wherein the information includes pressure.

4. The apparatus of claim 2 wherein the first desired configuration is different from the second desired configuration, and wherein the control system is arranged to cause the first configurable line card flapper to be positioned in the first desired configuration and to cause the second configurable line card flapper to be positioned in the second desired configuration.

5. The apparatus of claim 4 wherein the control system is arranged to actuate the first flapper tracker to cause the first configurable line card flapper to be positioned in the first desired configuration, the control system further being arranged to actuate the second flapper tracker to cause the second configurable line card flapper to be positioned in the second desired configuration.

6. The apparatus of claim 1 wherein the sensor arrangement comprises a first set of sensors associated with the first line card module and a second set of sensors associated with the second line card module.

7. The apparatus of claim 1 wherein each of the plurality of flapper trackers comprise an electrical feedback control mechanism.

8. The apparatus of claim 1 wherein the first configurable line card flapper is positioned in a first desired configuration and the second configurable line card flapper is positioned in a second desired configuration different from the first desired configuration, each of the first desired configuration and the second desired configuration arranged to cover a respective one of the first opening and the second opening such that between ten percent and ninety-five percent of the respective one of the first opening and the second opening is covered.

9. A method comprising:
obtaining information relating to a plurality of line card modules included in a chassis, the chassis further including a plurality of configurable line card flappers, wherein each configurable line card flapper of the plurality of configurable line card flappers is associated with a corresponding line card module of the plurality of line card modules;
determining, using the information, a first desired configuration of a first line card flapper of the plurality of configurable line card flappers;
determining, using the information, a second desired configuration of a second line card flapper of the plurality of configurable line card flappers;
positioning the first line card flapper in the first desired configuration; and
positioning the second line card flapper in the second desired configuration;
wherein the chassis includes at least a first flapper tracker and a second flapper tracker, wherein positioning the first line card flapper in the first desired configuration includes activating the first flapper tracker to position the first line card flapper and positioning the second line card flapper in the second desired configuration includes activating the second flapper tracker to position the second line card flapper, the first flapper tracker installed on a first line card module and the second flapper tracker installed on a second line card module;
and wherein the first flapper tracker installed on the first line card module and the second flapper tracker installed on the second line card module each comprise a mechanical pin for positioning the first line card flapper or the second line card flapper and an electrical feedback control system.

10. The method of claim 9 further including:
ceasing air flow in the chassis before positioning the first line card flapper in the first desired configuration and before positioning the second line card flapper in the second desired configuration; and
resuming the air flow in the chassis after positioning the first line card flapper in the first desired configuration and after positioning the second line card flapper in the second desired configuration.

11. The method of claim 9 wherein the information includes pressure information relating to at least one line card module of the plurality of line card modules.

12. The method of claim 9 wherein the first desired configuration is different from the second desired configuration.

13. The method of claim 9 wherein the chassis includes a plurality of sensors operable to monitor temperature, pressure, and power demand.

14. An apparatus comprising:
a first component, the first component having a first opening defined therein, the first component further having a second opening defined therein, wherein the first component includes at least a first configurable line card flapper and a second configurable line card flapper, the first configurable line card flapper being arranged to at least partially cover the first opening, the second configurable line card flapper being arranged to at least partially cover the second opening;
a plurality of line card modules, the plurality of line card modules including a first line card slot and a second line card slot, the first line card slot being associated with the first opening and the second line card slot being associated with the second opening;
a first line card module interfaced with the first line card slot;
a second line card module interfaced with the second line card slot;
a plurality of flapper trackers, the plurality of flapper trackers comprising a first flapper tracker arranged to facilitate positioning the first configurable line card flapper and a second flapper tracker arranged to facilitate positioning the second configurable line card flapper, the first flapper tracker installed on the first line card module and the second flapper tracker installed on the second line card module; and
logic encoded in one or more tangible non-transitory, computer-readable media for execution and when executed operable to obtain information relating to the plurality of line card modules, and to determine, using the information, a first desired configuration of the first configurable line card flapper and a second desired configuration of the second configurable line card flapper;
wherein the apparatus comprises a chassis housing the first line card module, the second line card module, and a fan array and wherein the first flapper tracker installed on the first line card module and the second flapper tracker installed on the second line card module each comprise a mechanical pin for positioning the first configurable line card flapper or the second configurable line card flapper and an electrical feedback control system.

15. The apparatus of claim 14 wherein the first desired configuration is different from the second desired configuration.

16. The apparatus of claim 14 wherein the logic is further operable to cause the first configurable line card flapper to be positioned in the first desired configuration and to cause the second configurable line card flapper to be positioned in the second desired configuration.

17. The apparatus of claim 16 wherein the logic is further operable to turn off a fan of the fan array to cause air flow to be ceased before positioning the first configurable line card flapper in the first desired configuration and before positioning the second configurable line card flapper in the second desired configuration.

18. The apparatus of claim 15 wherein the information includes pressure information relating to the plurality of line card modules.

* * * * *